(12) United States Patent
Konishi et al.

(10) Patent No.: US 7,301,781 B2
(45) Date of Patent: *Nov. 27, 2007

(54) SEMICONDUCTOR MODULE

(75) Inventors: Satoru Konishi, Saku (JP); Tsuneo Endoh, Komoro (JP); Masaaki Tsuchiya, Tobu (JP); Hirokazu Nakajima, Saku (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/585,159

(22) Filed: Oct. 24, 2006

(65) Prior Publication Data

US 2007/0035004 A1 Feb. 15, 2007

Related U.S. Application Data

(63) Continuation of application No. 10/733,289, filed on Dec. 12, 2003, now Pat. No. 7,154,760.

(30) Foreign Application Priority Data

Dec. 27, 2002 (JP) ............................. 2002-378911

(51) Int. Cl.
   H05K 7/02 (2006.01)
   H05K 7/06 (2006.01)
   H05K 7/08 (2006.01)
   H05K 7/10 (2006.01)

(52) U.S. Cl. ...................... 361/783; 361/784; 361/803

(58) Field of Classification Search .................... None
See application file for complete search history.

(56) References Cited

U.S. PATENT DOCUMENTS

| 5,386,343 | A | 1/1995 | Pao |
| 5,814,883 | A | 9/1998 | Sawai et al. |
| 5,866,952 | A | 2/1999 | Wojnarowski et al. |
| 5,931,833 | A | 8/1999 | Silverstein |
| 5,939,783 | A | 8/1999 | Laine et al. |
| 6,583,512 | B2 | 6/2003 | Nakaoka et al. |
| 6,741,125 | B2 | 5/2004 | Arai et al. |

FOREIGN PATENT DOCUMENTS

| JP | 2000-58741 | 2/2000 |
| JP | 2001-110986 | 4/2001 |

*Primary Examiner*—Tuan T. Dinh
(74) *Attorney, Agent, or Firm*—Mattingly, Stanger, Malur & Brundidge, P.C.

(57) ABSTRACT

The present invention realizes strengthening of a ground of a lower-surface ground electrode of an upper semiconductor chip and miniaturization in a semiconductor module on which two semiconductor chips are mounted in a stacked manner. A lower semiconductor chip is fixed to a bottom of a recess formed in an upper surface of a module board, and an upper semiconductor chip is fixed to an upper surface of a support body made of conductor which is formed over the upper surface of the module board around the recess. External electrode terminals and a heat radiation pad are formed over a lower surface of the module board.

6 Claims, 10 Drawing Sheets

SEMICONDUCTOR MODULE

This application is a continuation application of U.S. application Ser. No. 10/733,289, filed Dec. 12, 2003, now U.S. Pat. No. 7,154,760 now allowed, the entirety of which is incorporated herein by reference.

BACKGROUND OF THE INVENTION

The present invention relates to a semiconductor module, and more particularly to a semiconductor module which can arrange a plurality of semiconductor chips in a vertically stacked manner while preventing them from coming into contact with each other and, at the same time, can strengthen a ground of an upper semiconductor chip.

As an example of a semiconductor module (semiconductor device) which mounts semiconductor chips in which active elements such as transistors are incorporated and chip parts in which passive elements such as resisters and capacitors are incorporated on a printed wiring board respectively, a hybrid module has been known (see Patent Reference 1, for example).

Further, a product which incorporates a plurality of semiconductor chips in a package has been known (see Patent Reference 2, for example).

[Patent Reference 1]

Japanese Unexamined Patent Publication 2000-58741 (Pages 5 and 6, FIG. 1)

[Patent Reference 2]

Japanese Unexamined Patent Publication 2001-110986 (left column on Page 7)

SUMMARY OF THE INVENTION

A large number of electronic parts are incorporated into terminal equipment (mobile telephone or the like) for mobile communication. Rapid miniaturization and sophistication of functions have been in progress also with respect to a high frequency amplifying device (power amplifier module: PA) which is incorporated into a transmission system of the mobile telephone. As one communication method, the GSM (Global System for Mobile Communication) method has been known. Although a current profile size of a power amplifier module for this GSM method is set such that a longitudinal size is 10 mm and a lateral size is 8 mm, it is expected that the profile size will be set such that a longitudinal size is 6 mm and a lateral size is 5 mm as a main stream of the next generation module.

Further, also in the CDMA (Code Division Multiple Access) field, although a current profile size of a power amplifier module is set such that a longitudinal size is 6 mm and a lateral size is 6 mm, it is expected that the profile of a size that the longitudinal size is 5 mm and a lateral size is 5 mm will be requested and, thereafter, the profile size in which the longitudinal size is 4 mm and the lateral size is 4 mm will be further requested sequentially.

In such an ultra-miniaturized power amplifier module, with mere two-dimensional mounting of parts on a surface of a module board having the printed wiring board constitution, chip parts including semiconductor chips in which active elements such as transistors or the like are incorporated, passive elements formed of resisters (chip resisters), capacitors (chip capacitors) and the like cannot be mounted and hence, three-dimensional mounting becomes necessary.

On the other hand, as shown in Japanese Unexamined Patent Publication 2001-110986, with respect to the structure which arranges the semiconductor chips in parallel, the miniaturization of the product is impeded. Further, in the laminated mounting structure which mounts other semiconductor chip on an upper surface of the semiconductor chip, there exists a drawback that it is difficult to strengthen a reference potential electrode (ground electrode) on a back surface of an upper-side semiconductor chip.

Accordingly, it is an object of the present invention to strengthen a ground of a lower-surface ground electrode of an upper-side semiconductor chip in a semiconductor module having a constitution in which a plurality of semiconductor chips are stacked and mounted in an overlapped manner.

It is another object of the present invention to miniaturize a semiconductor module into which a plurality of semiconductor chips, passive parts and the like are incorporated.

The abovementioned objects, other objects and novel features of the present invention will become apparent from the description of this specification and attached drawings.

To briefly explain the summary of typical inventions among inventions disclosed in this specification, they are as follows.

A semiconductor module according to the present invention includes:

a module board which is formed of a printed wiring board having a recess for mounting a first semiconductor chip (lower semiconductor chip) on an upper surface thereof and having a support body for mounting a second semiconductor chip (upper semiconductor chip) on the upper surface thereof around the recess;

the first semiconductor chip fixed to the chip mounting layer on a bottom of the recess in a posture that electrodes formed over a main surface thereof are arranged at an upper side;

the second semiconductor chip fixed to an upper surface of the support body in a posture that electrodes formed over a main surface thereof are arranged at an upper side, the second semiconductor chip being larger than the first semiconductor chip;

conductive wires connecting the electrodes of the first semiconductor chip and wiring of the module board;

conductive wires connecting the electrodes of the second semiconductor chip and wiring of the module board;

electronic parts such as resistors, capacitors and the like mounted on the upper surface of the module board;

a sealing portion covering the upper surface of the module board while covering the first and the second semiconductor chips, the wires, the electronic parts and the like, the sealing portion having a fixed thickness and being made of insulating resin;

external electrode terminals provided to a lower surface of the module board and formed of a conductive layer;

a heat radiation pad provided to the lower surface of the module board and formed of a conductive layer which constitutes a reference potential electrode (ground electrode); and vias including the recess portion of the module board and formed of conductors which penetrate between the upper and lower surfaces of the module board, wherein the support body is formed of conductive balls which are formed over the vias and supports the second semiconductor chip, the second semiconductor chip is overlapped to the upper side of the first semiconductor chip in a non-contact state, a lower surface of the second semiconductor chip is set higher than a loop height of the wires connected to the first semiconductor chip, and both of the vias formed over the bottom of the recess and the vias connected to the support body are connected to the heat radiation pad.

The semiconductor module includes a high frequency power amplifying device which connects a plurality of transistors in a multiple stages based on cascade connection, a first-stage transistor of the high frequency power amplifying device is included in the second semiconductor chip, and a final-stage transistor of the high frequency power amplifying device is included in the first semiconductor chip. The semiconductor module is mounted on a mobile telephone. Further, a profile of the module board and a profile of the sealing portion assume the same size.

Such a semiconductor module can provide a three-dimensional mounting structure which arranges the second semiconductor chip (upper semiconductor chip) above the first semiconductor chip (lower semiconductor chip) and hence, compared to the structure which arranges the first and the second semiconductor chips on one plane in parallel, it is possible to miniaturize the semiconductor module. At the same time, since the semiconductor module adopts a structure which fixes the lower semiconductor chip to the bottom of the recess formed in the upper surface of the module board, it is possible to reduce a thickness of the semiconductor module by an amount corresponding to a depth of the recess.

In such a semiconductor module, the lower surface of the lower semiconductor chip is electrically connected to the heat radiation pad which is set to the reference potential (ground) of the lower surface of the module board through the vias, while the upper semiconductor chip is electrically connected to the heat radiation pad through the conductive balls and vias and hence, not to mention the lower semiconductor chip, the ground of the upper semiconductor chip is also strengthened.

Such a semiconductor module constitutes a high frequency power amplifying device, wherein although a first-stage transistor of the high frequency power amplifying device is incorporated into the upper semiconductor chip and a final-stage transistor which exhibits a higher heat value than the first-stage transistor is incorporated into the lower semiconductor chip, these transistors exhibit the favorable heat radiation property and grounds of the both transistors are strengthened and hence, the mobile telephone in which the semiconductor module is incorporated is operated in a stable manner.

PREFERRED EMBODIMENTS OF THE PRESENT INVENTION

Preferred embodiments of the present invention are explained in detail in conjunction with attached drawings. Here, in all drawings for explaining the embodiments of the present invention, parts having identical functions are given the same symbols and their repeated explanation is omitted.

Embodiment 1

Figure 1:
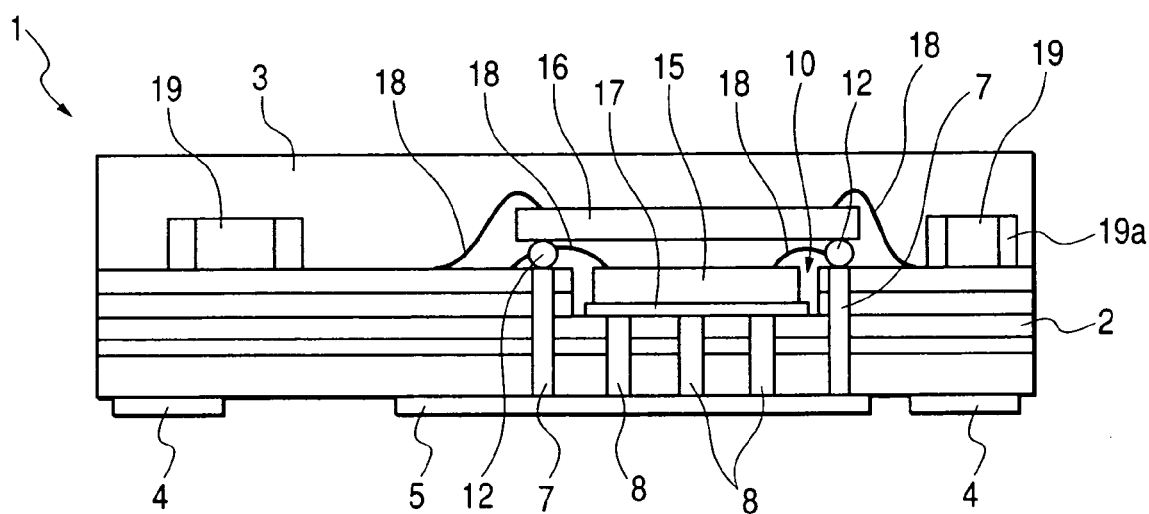
FIG. 1 is a schematic cross-sectional view of a semiconductor module according to one embodiment (embodiment 1) of the present invention.
Figure 2:
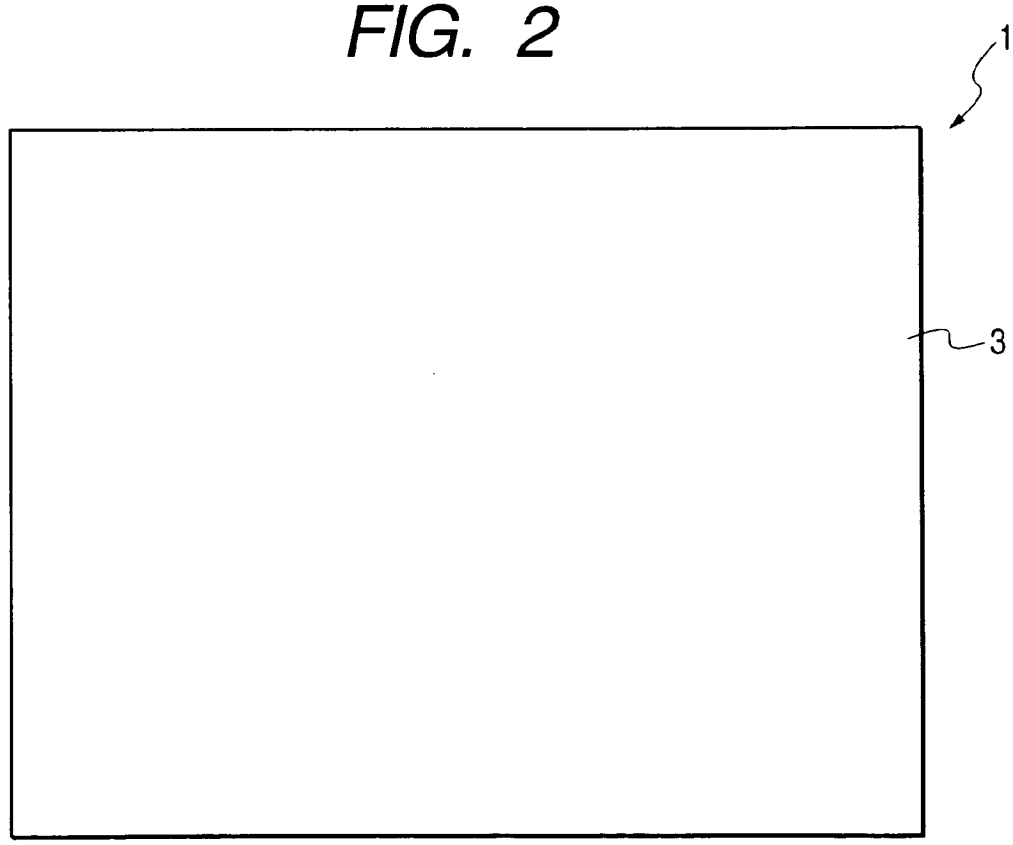
FIG. 2 is a plan view of the semiconductor module of the embodiment 1.
Figure 3:
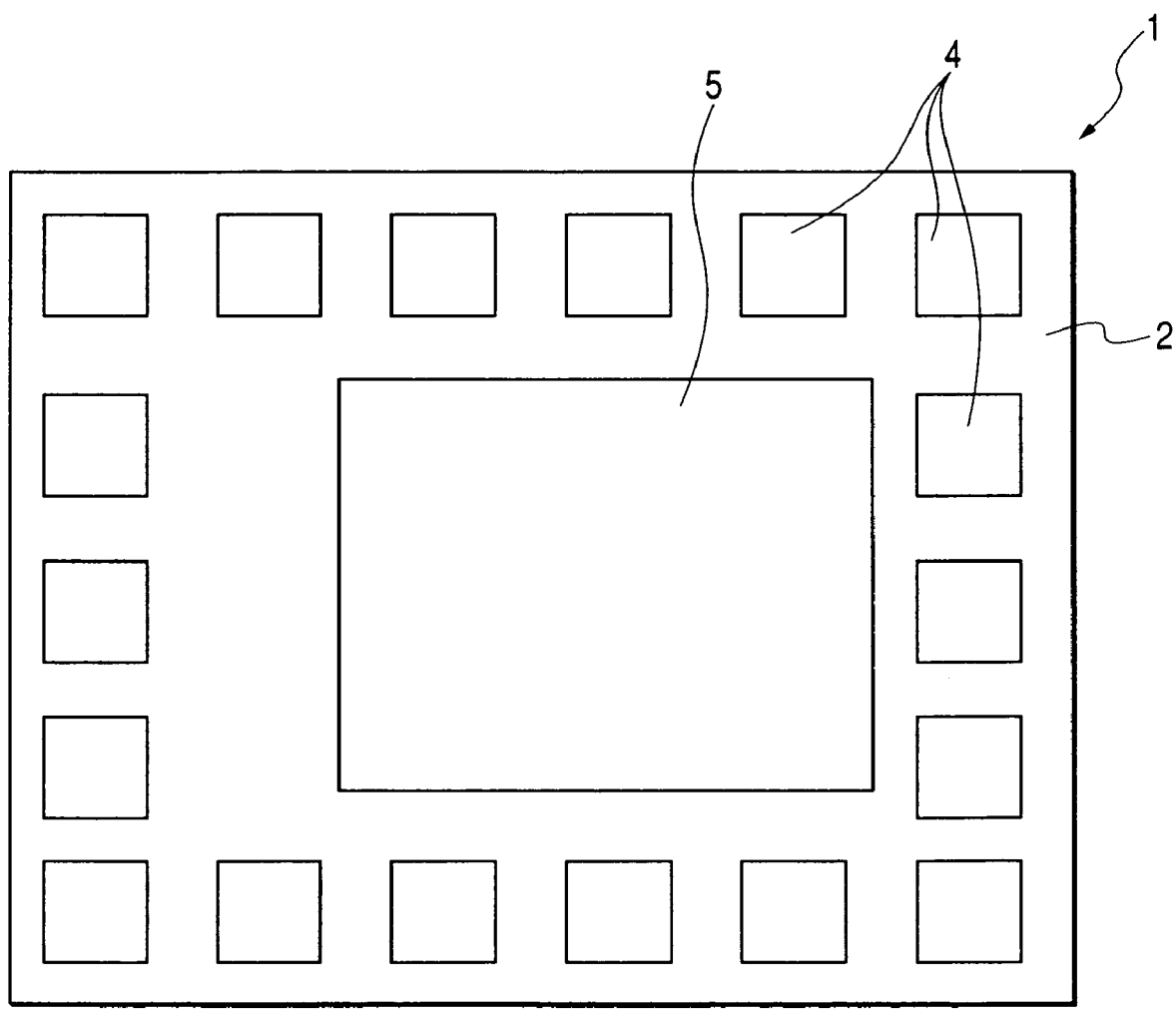
FIG. 3 is a bottom view of the semiconductor module of the embodiment 1.
Figure 4:
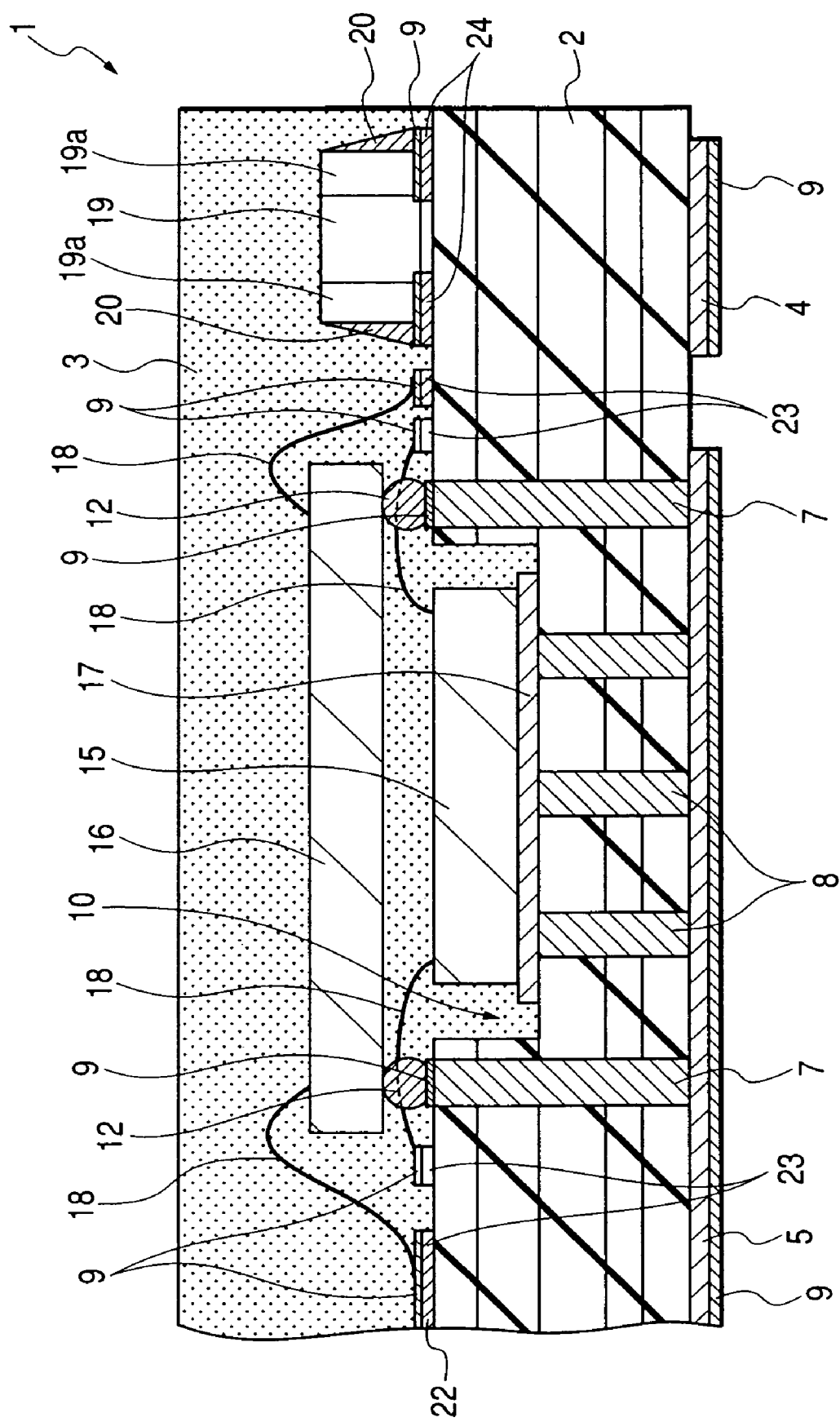
FIG. 4 is an enlarged cross-sectional view of a portion of the semiconductor module of the embodiment 1.
Figure 5:
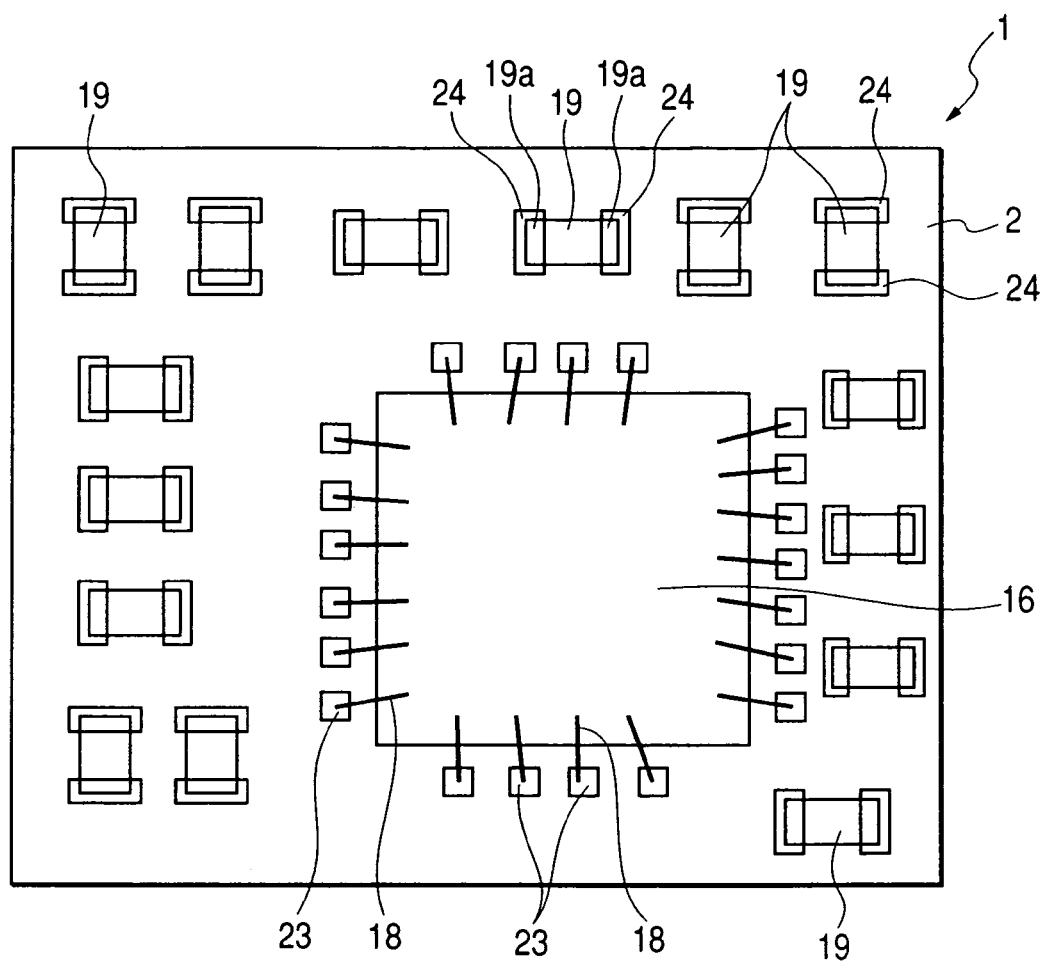
FIG. 5 is a schematic plan view of the semiconductor module of the embodiment 1 in a state that a sealing portion is removed.

FIG. 1 to FIG. 7 are views related with a semiconductor module which constitutes one embodiment (embodiment 1) of the present invention. FIG. 1 to FIG. 5 are views related with the structure of the semiconductor module. FIG. 1 is a cross-sectional view thereof, FIG. 2 is a plan view thereof, FIG. 3 is a bottom view thereof, FIG. 4 is an enlarged cross-sectional view of a portion thereof and FIG. 5 is a schematic plan view thereof in a state that a sealing portion is removed.

The semiconductor module (semiconductor device) 1 of this embodiment 1 includes, as shown in FIG. 1 to FIG. 3, a module board 2 having a quadrangular shape in appearance, a sealing portion (a package) 3 which is formed over an upper surface of the module board 2 in an overlapped manner, and a plurality of external electrode terminals 4 and heat radiation pads 5 which are formed over a lower surface of the module board 2.

In manufacturing the semiconductor module 1, as described later, electronic parts including semiconductor chips are mounted on an upper surface of a module base board and, thereafter, a resin sealing layer having a fixed height is formed over an upper surface of the module base board such that the resin sealing layer covers the electronic parts and the like and, subsequently, the module base board is cut and separated in the longitudinal direction as well as in the lateral direction including the resin sealing layer which is overlapped to the module base board thus manufacturing a plurality of semiconductor modules 1 at a time. Accordingly, it is possible to provide the structure in which side faces of the module board 2 and side faces of the sealing portion 3 are aligned with each other and end portions of the sealing portion 3 are not positioned outside end portions of the module base board 2. As a result, the semiconductor module 1 can be manufactured in a miniaturized size.

The module board 2 is constituted of a printed circuit board (PCB). The PCB adopts the structure in which a plurality of dielectric layers (insulation films) are laminated to each other and includes conductive layers formed of given wiring patterns on upper and lower surfaces and inside thereof and these upper and lower conductive layers are electrically connected to each other through conductors which extend vertically. In this embodiment 1, although not particularly limited, the dielectric layers are provided in five layers. Wiring 22 is formed of the conductive layers and the conductors.

The external electrode terminals 4 and the heat radiation pads 5 are formed of the conductive layers formed over the lower surface of the module board 2. Wire connection pads 23 and electrode connection pads 24 are formed of the conductive layers formed over the upper surface of the module board 2.

The external electrode terminals 4 and the heat radiation pads 5 are formed of the conductive layers formed over the lower surface of the module board 2. The wire connection pads 23 and electrode connection pads 24 are formed of the conductive layers which are formed over the upper surface of the module board 2.

Further, in this embodiment 1, recesses 10 are formed in the upper surface of the module board 2. Further, through holes which penetrate the module board 2 vertically are formed in bottoms of these recesses 10 and, at the same time, conductors are filled in the through holes thus forming vias 8. The vias 8 are connected to heat radiation pads 5. The heat radiations pad 5 has an area which is larger than an area of the external electrode terminal 4.

Further, through holes are formed in the module board 2 around the recess 10 and, at the same time, conductors are filled in the through holes thus forming vias 7. Lower ends of the vias 7 are also connected to the heat radiation pad 5.

The conductor layers and the conductors are formed of metal. For example, the conductive layer which is formed over upper and lower surfaces of the module board 2 is formed of a Ti (lower layer)/TiN layer and Ti (lower layer)/Al—Cu—Si layer which is formed over the Ti (lower layer)/TiN layer although not shown in the drawing. Further, a plating film 9 is formed over a surface of the conductive layer to which an adhesive agent and the wire are connected in order to facilitate the connection. The plating film 9 is, for example, formed over surfaces of the wire connection pads 23 and electrode connection pads 24 and upper surfaces of the vias 7. The plating film 9 is made of Ti (lower layer)/Ni, for example.

The external electrode terminals 4 are, as shown in FIG. 3, arranged on a quadrangular bottom surface of the semiconductor module 1 along respective sides at a given pitch. Then, at a center portion of the bottom surface, the heat radiation pad 5 having considerably wider area than the external electrode terminal 4 is arranged.

A recess (cavity) 10 is formed in an approximately center of the upper surface of the module board 2. The semiconductor chip (first semiconductor) 15 is mounted on a bottom of the recess 10 by way of an adhesive material 17. The vias 8 which are formed in the bottom of the recess 10 play a role of rapidly transmitting heat generated by the semiconductor chip 15 fixed to the bottom of the recess 10 to the heat radiation pad 5. When the semiconductor module 1 is mounted on the mounting board, the larger the heat radiation pad 5, it is possible to effectively transmit the heat to the mounting board side.

Further, although the vias 7 are formed also in the upper surface portion (surface higher than the bottom of the recess by one step) of the module board 2 around the recess 10, support bodies 12 made of a conductor are adhered to and fixed to the vias 7.

The support bodies 12 are provided around the recess 10 such that the support bodies 12 surround the recess 10. The semiconductor chip (second semiconductor chip) 16 is mounted on the support bodies 12. As the support bodies 12, for example, solder balls are used. The plating film 9 is formed over upper surfaces of the vias 7 to which the support bodies 12 are connected so as to facilitate the adhesiveness with the support bodies 12.

In this embodiment 1, the semiconductor boards not shown in the drawing of the semiconductor chip 15 and the semiconductor chip 16 are electrically connected with the corresponding vias 8, 7. In this embodiment 1, the semiconductor boards assume a first reference potential, that is, a ground potential. Accordingly, the heat radiation pads 5 also assume the ground potential.

Two semiconductor chips 15, 16 are vertically overlapped to each other with a given distance therebetween (non-contact state) and hence, the semiconductor chip 15 which is fixed to the bottom of the recess 10 is referred to as the lower semiconductor chip and the semiconductor chip 16 which is fixed to the support bodies 12 is also referred to as the upper semiconductor chip. The lower semiconductor chip is mounted on the bottom of the recess 10 and the upper semiconductor chip is mounted on the support bodies 12 which are provided around the recess 10 and hence, as the upper semiconductor chip 16, a semiconductor chip larger than the lower semiconductor chip 15 is used.

Since the lower semiconductor chip 15 is connected to a plurality of the vias 8 formed in the bottom of the recess 10, the heat radiation characteristics are favorable. Accordingly, even when a heat value of the lower semiconductor chip is larger than a heat value of the upper semiconductor chip, it is possible to operate the lower semiconductor chip in a stable manner. In this embodiment 1, the upper semiconductor chip may be of a type which incorporates an active element having a control system of a small heat value (transistor, for example), while the lower semiconductor chip may be of a type which incorporates a transistor having a drive system which exhibits a heat value larger than a heat value of the upper semiconductor chip.

Both of the lower semiconductor chip and the upper semiconductor chip are respectively mounted in a posture that electrodes not shown in the drawing are formed over the upper surfaces. Further, the electrodes of the chips and given wiring layer portions of the module board 2 are electrically connected with each other using conductive wires 18.

A height of a lower surface of the upper semiconductor chip 16 is set higher than a loop height of the wires connected to the lower semiconductor chip 15 and hence, it is possible to prevent the occurrence of a short-circuit defect which may be caused when the wire 18 connected to the lower semiconductor chip 15 comes into contact with the lower surface of the upper semiconductor chip 16. Accordingly, as a matter of course, it is possible to arrange the semiconductor chip 16 above the semiconductor chip 15 while preventing the semiconductor chip 16 from coming into contact with the semiconductor chip 15.

Over the upper surface of the module board 2, as shown in FIG. 4 and FIG. 5, a plurality of electronic parts 19 are mounted. The electronic parts 19 are chip parts such as chip resistors, chip capacitors and chip fixed coils. The chip parts respectively form electrodes 19a at both ends thereof and the chip parts are mounted on the module board 2 such that the electrodes 19a are electrically connected with the wiring layer of the module board 2 using solder 20. As the solder 20, solder with a small lead content (referred to as "Pb free solder" hereinafter) is used in the embodiment 1. As the Pb free solder, solder which contains Zn or Bi in Sn, Ag or Cu is used. In FIG. 5, the solder 20 is omitted.

Here, by selecting a pattern of the wiring layer formed over the upper surface of the module board 2, it is also possible to mount electronic parts in which active elements are incorporated, that is, semiconductor chips or resin-sealed miniaturized transistors or the like.

Over the upper surface side of the module board 2, the sealing portion 3 which covers the semiconductor chips 15, 16, wires 18, the electronic parts 19 and the like is formed. The sealing portion 3 is formed of an insulating resin. The sealing portion 3 is formed of, for example, silicone resin having the Young's modulus of 1 to 200 Mpa and the thermal expansion coefficient α of $180 \times 10^{-6}/°$ C. to $200 \times 10^{-6}/°$ C. or epoxy resin having the Young's modulus 1000 to 10000 Mpa. With the use of such a sealing portion 3, it is possible to have an advantageous effect that the solder flash caused by the expansion of solder in a package in a reflow at the time of mounting at a client side can be prevented. That is, when the semiconductor module 1 is mounted on the mounting board by performing the reflow using a bonding material such as solder, a phenomenon (solder flash phenomenon) in which the solder at the bonding portion of the electronic part incorporated into the sealing portion 3 of the semiconductor module 1 is expanded due to heat generated by the reflow and the solder leaks to the outside through an interface between the module board 2 and the sealing portion 3 is liable to occur easily. Since the thermal expansion coefficient α of the module board 2 is approximately $7 \times 10^{-6}/°$ C., by forming the sealing portion 3 using the resin having the abovementioned Young's modulus and thermal expansion coefficient, the adhesive strength between the module board 2 and the sealing portion 3 can be enhanced whereby the generation of the solder flash phenomenon can be suppressed.

The semiconductor chips 15, 16 are formed based on a silicon single crystalline board, for example, wherein one or a plurality of electronic elements such as active elements made of transistors or the like are formed at given positions by the normal-use epitaxial growth or the selection and the diffusion of impurities which become donors or acceptors. The electrodes of respective electronic elements are connected by wiring when necessary and given electrodes are led out to the upper surface of the semiconductor chip as electrode terminals. Further, the semiconductor chips 15, 16 may be chips which constitute active elements such as transistors made of compound semiconductors.

The semiconductor module 1 is, for example, configured such that a thickness of the module board 2 including the external electrode terminals 4 and the heat radiation pads 5 formed over the lower surface thereof is 0.75 mm and a thickness of the sealing portion 3 is 0.9 mm. Although the semiconductor module 1 adopts the constitution which stacks the semiconductor chips in two stages, it is possible to reduce the thickness of the semiconductor module 1.

Figure 6:
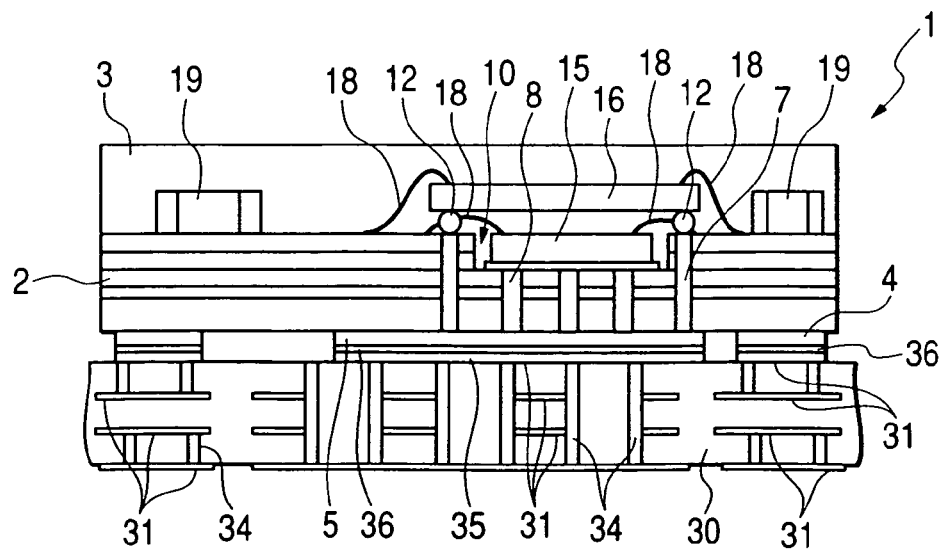
FIG. 6 is a schematic cross-sectional view showing a state in which the semiconductor module of the embodiment 1 is mounted on a mounting board.

Such a semiconductor module 1 is used in a form that the semiconductor module 1 is mounted on a mounting board 30 formed of a PCB board as shown in FIG. 6. The mounting board 30 includes wiring layers 31 of given patterns on upper and lower surfaces and the inside thereof and, at the same time, these wiring layers 31 are electrically connected to each other through conductors 34 filled in through holes. The wiring layer 31 in the mounting board 30 is formed of a plurality of layers. With respect to the wiring layers 31 formed over the upper and the lower surfaces of the mounting board 30, a plating film not shown in the drawing for enhancing the connection property is formed over portions thereof to which the electrodes are connected. The plating film is formed of, for example, an Ni layer (lower layer)/Pb free solder. Further, on an upper surface of the mounting board 30, heat radiation pads 35 are formed corresponding to the heat radiation pads 5 of the semiconductor module 1.

The semiconductor module 1 is mounted as shown in FIG. 6 by overlapping the external electrode terminals 4 and the heat radiation pads 5 formed over the lower surface to the wiring layer 31 and the heat radiation pads 35 formed over the upper surface of the mounting board 30 and, thereafter, by performing the reflow of solder 36 which is formed over the wiring layer 31 and the heat radiation pads 35 in advance.

Next, the manufacturing method of the semiconductor module 1 of this embodiment 1 is explained in conjunction with FIG. 7(a) to FIG. 7(f). The semiconductor module 1 is manufactured by way of respective steps constituting of preparation of a module base board, mounting of chip-like electronic parts on the upper surface of the module base board, mounting of the lower semiconductor chip (first semiconductor chip) on the bottom of the recess, wire bonding in the first semiconductor chip, fixing of the support bodies to the vias around the recess, mounting of the upper semiconductor chip (second semiconductor chip) to the upper surfaces of the support bodies, wire bonding in the second semiconductor chip, formation of the resin sealing layer on the upper surface of the module board, and cutting and separation of the module base board.

Figure 7A:
FIG. 7 is a schematic step cross-sectional view showing states of respective steps in the manufacture of the semiconductor module of the embodiment 1.
Figure 7B:
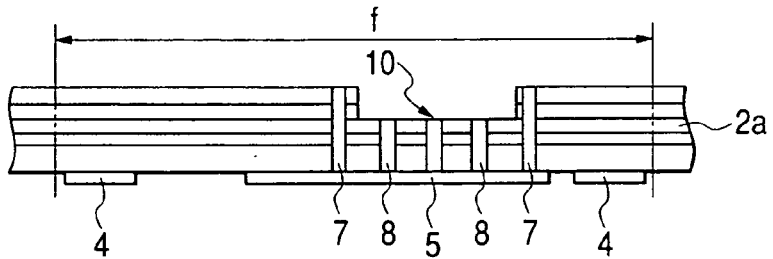

As shown in FIG. 7(a), first of all, the module base board 2a is prepared. The module base board 2a is formed of a quadrangular PCB which arranges product forming portions f longitudinally and laterally in an array (arrayed arrangement of n rows and m columns). In FIG. 7(a), a size region defined by f is the product forming portion. An enlarged view of the product forming portion f is shown as a cross-sectional view in FIG. 7(b). The structure of the product forming portion f is the structural portion which has already been explained as the module board 2 of the semiconductor module 1. The product forming portion f is configured such that the recess 10 is formed at an approximately center of the upper surface, the vias 8, 7 are formed in the bottom of the recess 10 and the upper surface of the module board 2 around the recess 10, the wiring layer is formed over the upper surface of the module board 2, and the external electrode terminals 4 and the heat radiation pads 5 are formed over the lower surface.

Figure 7C:
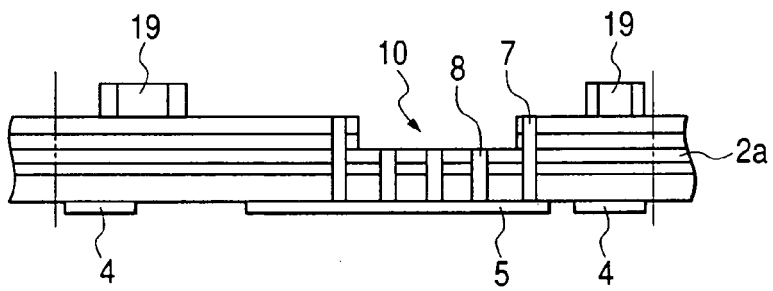

Next, as shown in FIG. 7(c), the chip-like electronic parts 19 are formed over the upper surface of the module board 2. Although the mounting structure has already been explained in conjunction with FIG. 4, the electrodes 19a provided at both ends of the chip-like electronic part 19 are placed on the electrode connection pads 24 on the upper surface of the module board 2, the solder 20 which is formed over the electrode connection pads 24 in advance by printing or the like is temporarily melted by heating (reflow) so as to fix the electrodes 19a to the electrode connection pads 24 (see FIG. 4). The chip-like electronic parts 19 to be mounted are, for example, passive parts such as chip resistors, chip capacitors, chip fixed coils and the like.

Figure 7D:
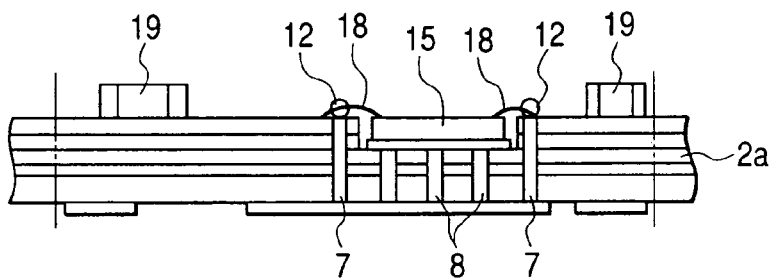

Next, as shown in FIG. 7(d), on the vias 7 which are formed over the module board 2 around the recess 10, the support bodies 12 made of the solder ball are adhered. Further, the semiconductor chip 15 (first semiconductor chip: lower semiconductor chip) is mounted on the bottom of the recess 10 by way of the adhesive material 17. Thereafter, the electrodes not shown in the drawing of the semiconductor chip 15 and the given wire connection pads 23 formed over the upper surface of the module board 2 are electrically connected to each other by the conductive wires 18.

Figure 7E:
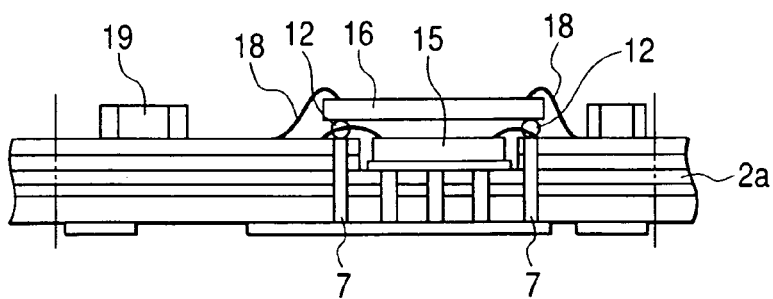

Next, as shown in FIG. 7(e), the semiconductor chip 16 (second semiconductor chip: upper semiconductor chip) are mounted on the support bodies 12 arranged on the upper surface of the module board 2 around the recess 10 using a given adhesive material (omitted from the drawing). Further, the electrodes not shown in the drawing of the upper semiconductor chip 16 and the given wire connection pads 23 formed over the upper surface of the module board 2 are electrically connected to each other by the conductive wires 18.

Figure 7F:
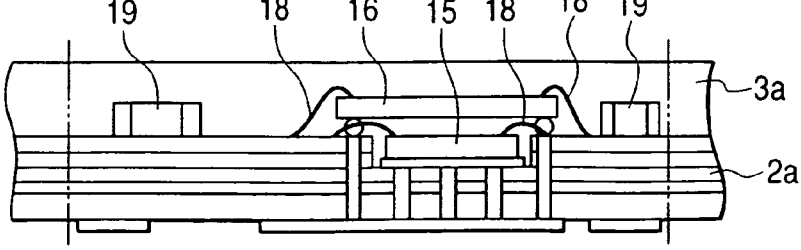

Next, as shown in FIG. 7(f), the resin sealing layer 3a having a given height is formed over the upper surface of the module base board 2a by a transfer molding method, for example, so as to cover the semiconductor chips 15, 16, the wires 18 and the electronic parts 19 mounted on the upper surface side of the module base board 2a.

Next, the module base board 2a is cut and separated longitudinally and laterally together with the resin sealing layer 3a overlapped to the module base board 2a so as to manufacture a plurality of semiconductor modules 1 shown in FIG. 1 to FIG. 3. Due to such cutting, the module base board 2a is formed into the module boards 2 and the resin sealing layer 3a is formed into the sealing portions 3.

Figure 8:
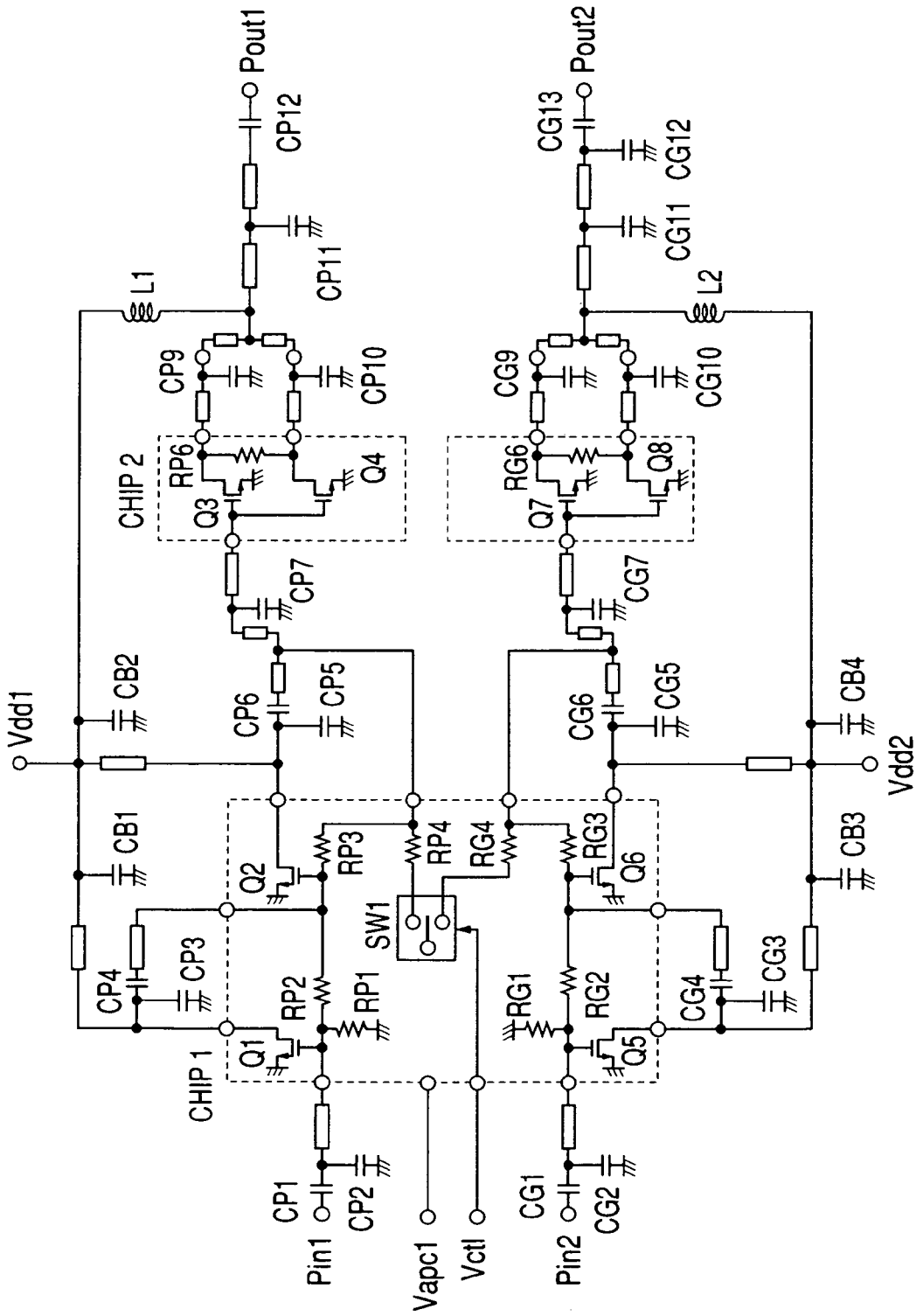
FIG. 8 is a circuit diagram of a high frequency power amplifying device which is applicable to the semiconductor module of the embodiment 1.

FIG. 8 is an example of a high frequency power amplifying device which is applicable to the semiconductor module of this embodiment 1. The high frequency power amplifying device has the circuit constitution shown in FIG. 8. This high frequency power amplifying device is configured to amplify two types of communication systems, wherein an amplifying system which amplifies each communication system adopts the three-stage constitution connecting the transistors based on the three-stage cascade connection.

That is, one communication system is configured such that an initial-stage transistor Q1, a next-stage transistor Q2 and final-stage transistors (output-stage amplifiers) Q3, Q4 which are connected in parallel are sequentially connected between an input terminal Pin1 and an output terminal Pout1. A power source voltage Vdd1 is applied to drain electrodes of respective transistors and gate electrodes of respective transistors are biased by a voltage inputted from a control terminal Vapc.

Further, another communication system is configured such that an initial-stage transistor Q5, a next-stage transistor Q6 and final-stage transistors (output-stage amplifiers) Q7, Q8 which are connected in parallel are sequentially connected between an input terminal Pin2 and an output terminal Pout2. A power source voltage Vdd2 is applied to drain electrodes of respective transistors and gate electrodes of respective transistors are biased in response to a control voltage inputted from the control terminal Vapc.

The control terminal Vapc is connected to a switch SW1, wherein the switch SW1 is changed over in response to a changeover signal from a changeover terminal Vctl and a control voltage of the control terminal Vapc is configured to perform the amplification of the communication system specified by the switch SW1.

The transistors Q1, Q2, Q5, Q6 are formed over the first semiconductor chip (chip 1) in a monolithic manner, while the output-stage transistors Q3, Q4, Q7, Q8 are formed over the single semiconductor chip (chip 2) in a monolithic manner.

In both communication systems, a large number of capacitive elements (CP, CG, CB) which are indicated by C, a large number of resistance elements (RP, RG) which are indicated by R and a large number of fixed coils which are indicated by L are incorporated into both communication systems thus constituting matching circuits and bias circuits.

In such a constitution, for example, one communication system adopts a DCS (Digital Cellular System 1800) method which sets the frequency band to 1710 to 1785 MHz and another communication system adopts a GSM (Global System for Mobile Communication) method which sets the frequency band to 880 to 915 MHz.

In the constitution of the embodiment 1, the chip 2 which incorporates the output-stage transistor of a large heat value therein is fixed to the bottom of the recess 10 and the chip 1 which incorporates the initial-stage and the next-stage transistors which exhibit heat values sufficiently smaller than the heat value of the output-stage transistor therein is mounted on the upper surfaces of the support bodies 12.

Following advantageous effects can be obtained by the embodiment 1.

(1) Since the semiconductor module 1 adopts the three-dimensional mounting structure which arranges the second semiconductor chip (upper semiconductor chip) 16 above the first semiconductor chip (lower semiconductor chip) 15, compared to the structure which arranges the first and the second semiconductor chips on the same plane in parallel, the semiconductor module 1 can be miniaturized.

(2) Since the semiconductor module 1 adopts the structure in which the lower semiconductor chip 15 is fixed to the bottom of the recess 10 formed in the upper surface of the module board 2, the semiconductor module can reduce a thickness thereof by an amount corresponding to the depth of the recess.

(3) The lower surface of the lower semiconductor chip 15 is electrically connected with the heat radiation pads 5 which assumes the reference potential (ground) of the lower surface of the module board 2 through the vias 8 and the upper semiconductor chip 16 is electrically connected with the heat radiation pads 5 through the support bodies 12 formed of solder balls and the vias 7 and hence, not to mention the lower semiconductor chip 15, the ground of the upper semiconductor chip 16 is also strengthened.

(4) With respect to the heat resistance of a path leading to the heat radiation pads 5 from the vias 8 and the heat resistance of a path leading to the heat radiation pads 5 from the support bodies 12 through the vias 7, since the support bodies 12, the vias 7, 8 are formed of conductors (metal) having low heat resistance, heat generated by the upper and lower semiconductor chips 15, 16 can be rapidly transmitted to the heat radiation pad 5. That is, when the heat radiation pad 5 of the semiconductor module 1 is adhered to the heat radiation pads 35 of the mounting board 30 using the bonding material (solder 36) having the low heat resistance such as solder, the heat generated by the upper and lower semiconductor chips 15, 16 are rapidly radiated to the mounting board 30 whereby the stable operation of the semiconductor module 1 is maintained.

For example, when a high frequency amplifying device for a mobile telephone is formed of the semiconductor module 1 of the present invention, in the amplifying stages having the multi-stage constitution, the semiconductor chip 15 which forms the final-stage (output-stage) transistor which generates a large heat value and the semiconductor chip 16 which forms the initial-stage transistor and the control-use transistor which exhibit small heat values are mounted on the upper surfaces of the support bodies 12 and hence, it is possible to provide the high frequency amplifying device which is miniaturized and exhibits the favorable heat radiation property. As a result, a mobile telephone in which this semiconductor module 1 is incorporated is also operated in a stable manner.

Embodiment 2

Figure 9:
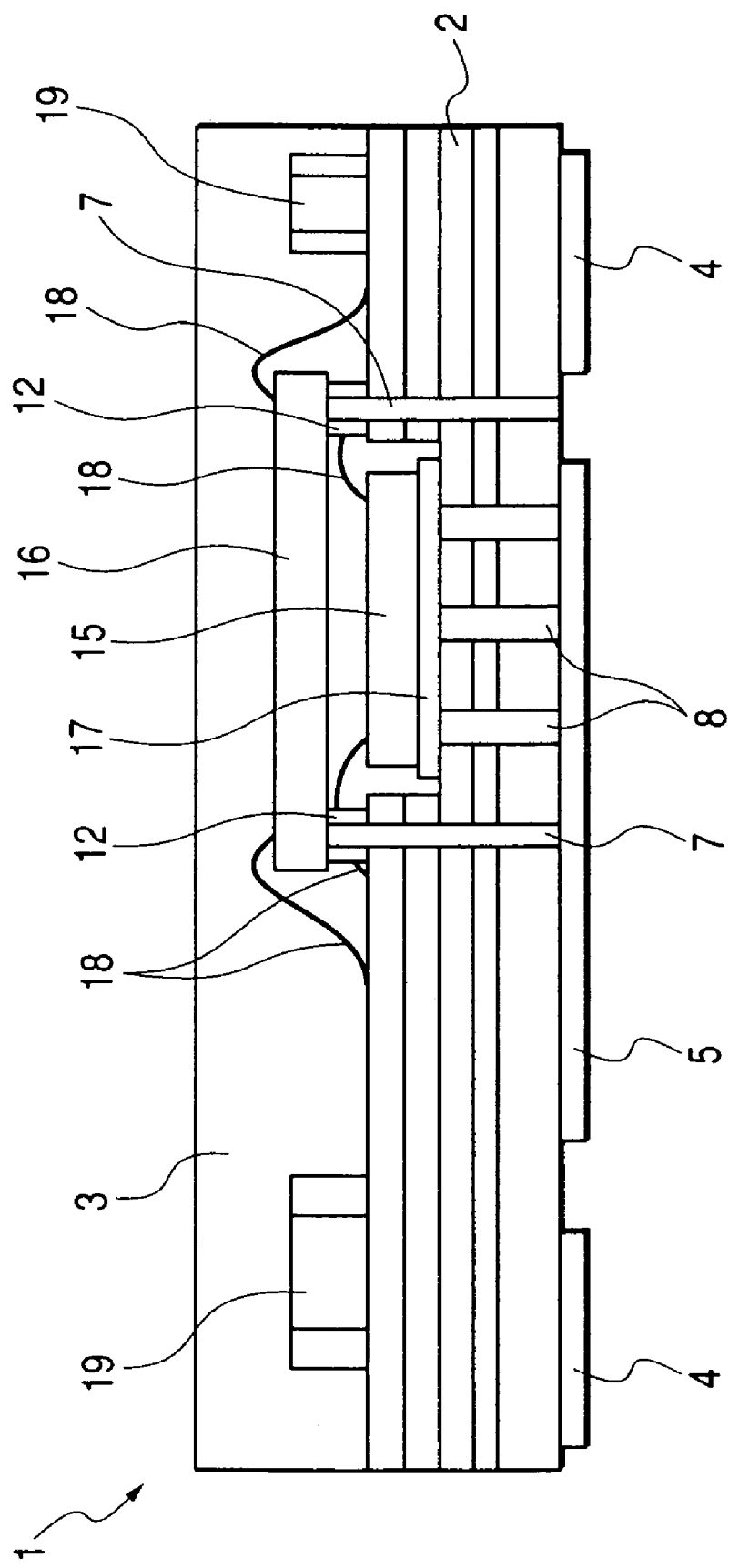
FIG. 9 is a schematic cross-sectional view showing a semiconductor module which constitutes another embodiment (embodiment 2) of the present invention.
Figure 10:
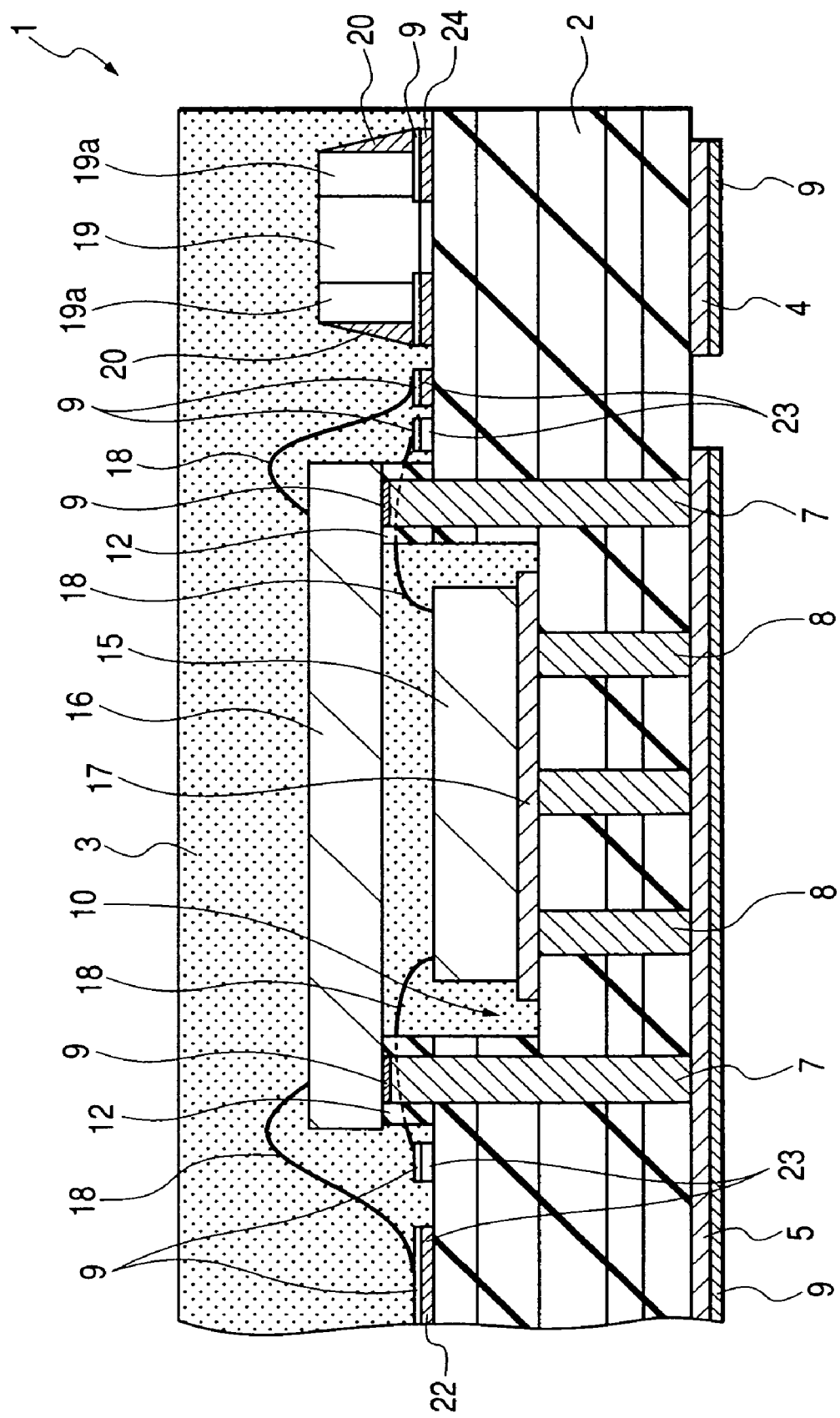
FIG. 10 is an enlarged cross-sectional view of a portion of the semiconductor module of the embodiment 2.
Figure 11:
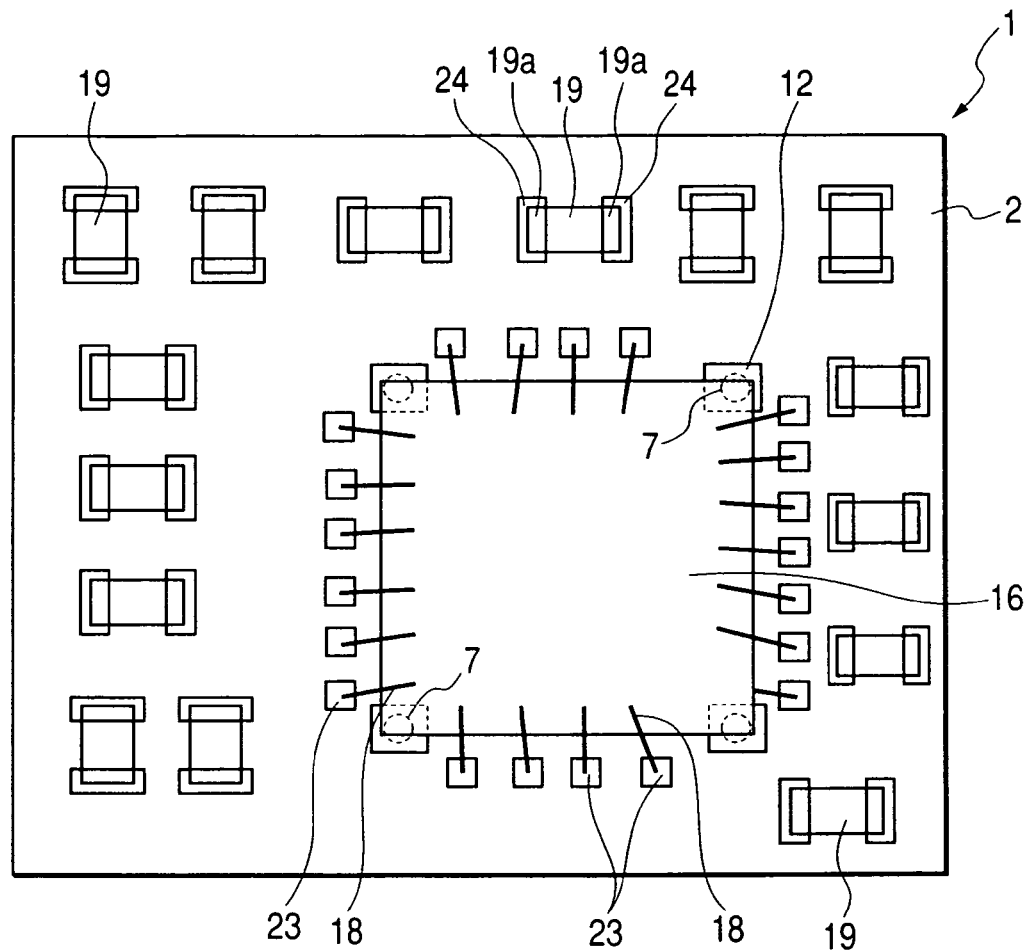
FIG. 11 is a schematic plan view of the semiconductor module of the embodiment 2 in a state that a sealing portion is removed.

FIG. 9 to FIG. 11 are views related to a semiconductor module according to another embodiment (embodiment 2) of the present invention. FIG. 9 is a schematic cross-sectional view showing the semiconductor module, FIG. 10 is an enlarged cross-sectional view of a portion of the semiconductor module, and FIG. 11 is a schematic plan view of the semiconductor module in a state that a sealing portion is removed.

The semiconductor module 1 of the second embodiment 2 is characterized in that, in the semiconductor module 1 of the embodiment 1, the support bodies 12 which support the upper semiconductor chip 16 and the module board 2 are integrally formed. That is, although the support bodies 12 are formed separately from the module board 2 in the embodiment 1, the support bodies 12 are simultaneously formed at the time of manufacturing the module board 2 in the embodiment 2.

Although the dielectric layer is formed of five layers in the semiconductor module 1 of the embodiment 1, in this embodiment 2, the dielectric layer is formed of six layers and, as shown in FIG. 11, the uppermost dielectric layer is formed of support bodies 12 which project in a quadrangular pattern and is arranged at a position where the upper semiconductor chip 16 can be supported. Further, via holes which vertically penetrate the module board 2 are formed in respective support bodies 12 and conductors are filled in the via holes thus forming the vias 7. These vias 7 are also connected to the heat radiation pads 5 formed over the lower surface of the module board 2. Plating films 9 are formed over the upper surfaces of the vias 7 which penetrate the center of the support bodies 12 and the lower surface of the semiconductor chip 16 is electrically connected to the plating film 9 portion by way of an adhesive material.

The semiconductor module 1 of this embodiment 2 also exhibits advantageous effects substantially equal to the advantageous effects obtained by the embodiment 1.

Figure 12:
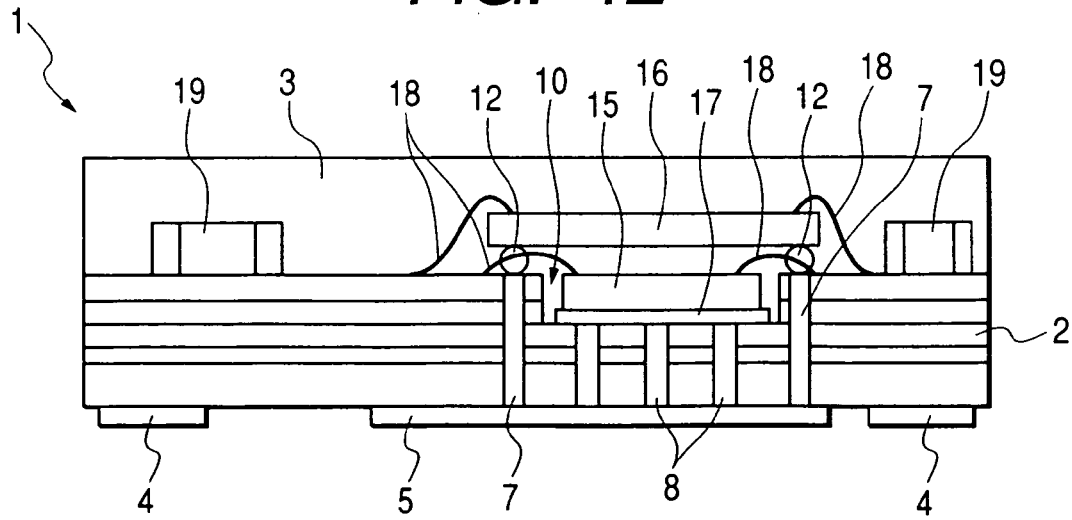
FIG. 12 is a schematic cross-sectional view showing a semiconductor module which constitutes another embodiment (embodiment 3) of the present invention.
Figure 13:
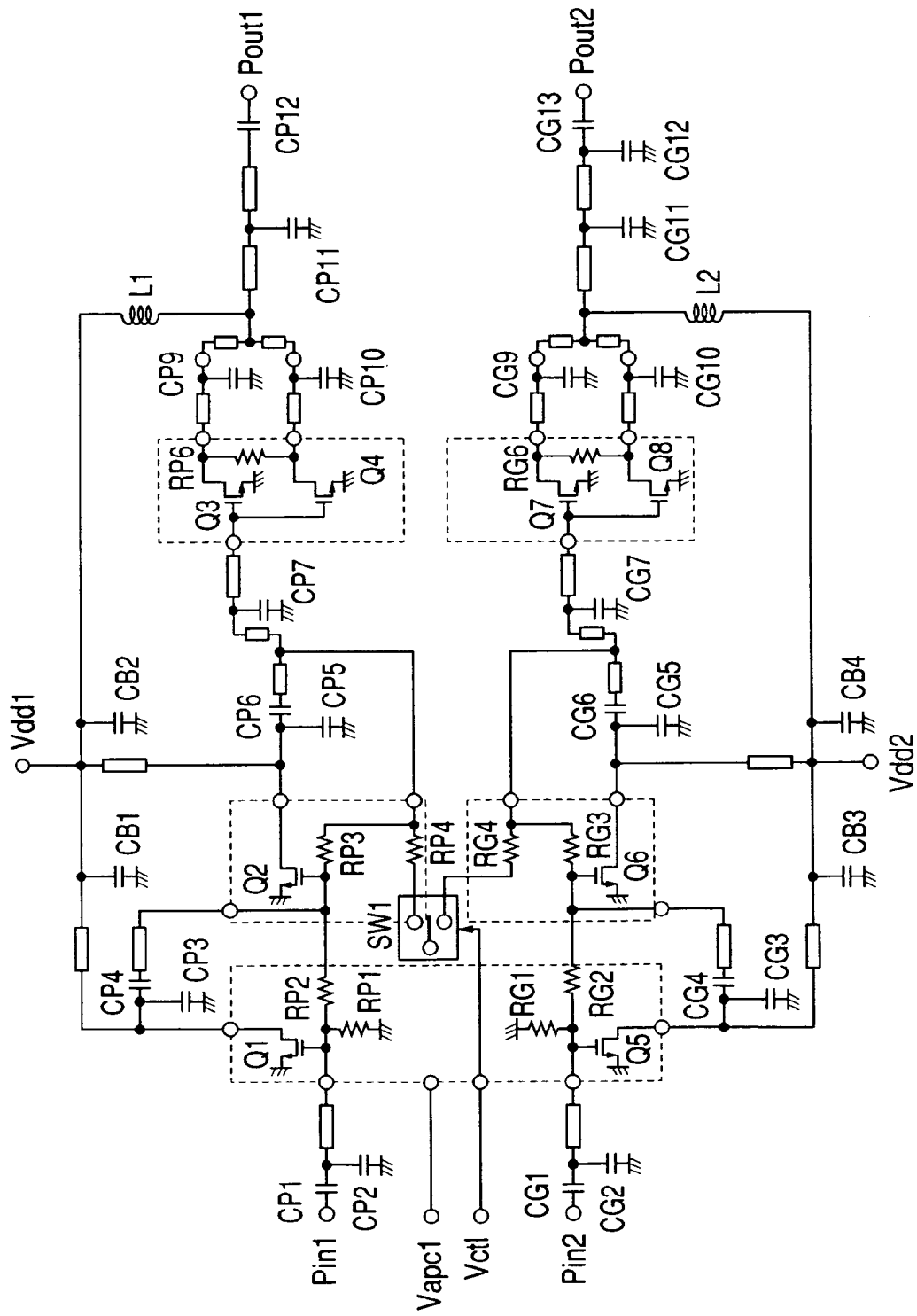
FIG. 13 is an equivalent circuit diagram of the semiconductor module of the embodiment 3.

FIG. 12 is a schematic cross-sectional view showing a semiconductor module which constitutes another embodiment (embodiment 3) of the present invention and FIG. 13 is an equivalent circuit diagram of the semiconductor module.

The semiconductor module 1 of the embodiment 3 substantially has, as shown in FIG. 12, the same structure as the embodiment 1. However, this embodiment differs from the embodiment 1 with respect to the semiconductor chip 15 which is mounted on the bottom of the recess 10 and the transistor which is incorporated into the semiconductor chip 16 mounted on the support body 12. FIG. 13 corresponds to FIG. 8 which is served for explaining the embodiment 1.

As shown in FIG. 13, one communication system is configured such that an initial-stage transistor Q1, a next-stage transistor Q2 and final-stage transistors (output stage) Q3, Q4 are sequentially connected between an input terminal Pin1 and an output terminal Pout1 and another communication system is configured such that an initial-stage transistor Q5, a next-stage transistor Q6 and final-stage transistors (output-stage amplifiers) Q7, Q8 which are connected in parallel are sequentially connected between an input terminal Pin2 and an output terminal Pout2.

In the semiconductor module 1 of the embodiment 1, the lower semiconductor chip 15 mounted on the bottom of the recess 10 incorporates the final-stage (output-stage) transistors Q3, Q4, Q7, Q8 therein, while the semiconductor chip 16 mounted on the upper surfaces of the support bodies 12 incorporates the control IC, the initial-stage transistors Q1, Q5 and the next-stage transistors Q2, Q6 therein.

To the contrary, in the semiconductor module 1 of this embodiment 3, the semiconductor chip 15 mounted on the bottom of the recess 10 incorporates the control IC and the initial-stage transistors Q1, Q5 therein, while the semiconductor chip 16 mounted on the upper surfaces of the support bodies 12 incorporates the next-stage transistors Q2, Q6 and the final-stage (output-stage) transistors Q3, Q4, Q7, Q8 therein.

However, due to the difference in the magnitude of the circuit, that is, when the heat value of the final-stage (output-stage) transistor is not large, it is possible to incorporate the final-stage (output-stage) transistors Q3, Q4, Q7, Q8 into the upper semiconductor chip 16 and to incorporate the control IC and the initial-stage transistors Q1, Q5 into the lower semiconductor chip 15. However, this can be realized provided that due to the heat radiation effect which transmits the heat generated by the upper semiconductor chip 16 to the heat radiation pads 5 through the support bodies 12 and the vias 7, the upper semiconductor chip 16 can be sufficiently operated in a stable manner.

Although the inventions made by the inventors have been specifically explained based on the embodiments, it is needless to say that the present invention is not limited to the abovementioned embodiments and various modifications can be made without departing from the gist of the present invention. Although the MOSFET (Metal Oxide Semiconductor Field Effect Transistor) is used as the amplifying element in the embodiment 1, the amplifying element may be formed of a bipolar-based transistor which contains other silicon or compound semiconductors.

To briefly explain the advantageous effects obtained by typical inventions among inventions disclosed in this specification, they are as follows.

(1) By arranging at least two semiconductor chips out of a plurality of semiconductor chips in a vertically overlapped manner, the packing density is enhanced whereby the semiconductor module can be miniaturized.

(2) The semiconductor module adopts the structure in which the recess is formed in the upper surface of the module board, the lower semiconductor chip is mounted on the bottom of the recess and the upper semiconductor chip is mounted on the upper surfaces of the support bodies above the lower semiconductor chip in a spaced-apart manner and hence, the thickness of the semiconductor module can be reduced.

(3) By mounting the semiconductor chip having the large heat value on the bottom of the recess where a plurality of vias are formed, the heat radiation property through the vias can be enhanced. Further, the upper semiconductor chip can enhance the heat radiation property through the support bodies or vias formed of conductors, the stable operation of the semiconductor module can be realized.

(4) The lower surface portion of the upper semiconductor chip is electrically connected to the heat radiation pads made of conductor which are formed over the lower surface of the module board by way of the support bodies and vias. Accordingly, the ground of the ground electrodes mounted on the lower surface of the upper semiconductor chip can be strengthened. Further, the lower semiconductor chip is also electrically connected to the heat radiation pads through the vias and hence, the ground of the ground electrodes mounted on the lower surface of the lower semiconductor chip can be strengthened. As a result, the stable operation of the semiconductor module can be realized.

(5) As described in the abovementioned advantageous effects (3) and (4), the semiconductor module can enhance the heat radiation property and can strengthen the ground and hence, by applying the semiconductor module to the high frequency amplifying device for a mobile telephone, it is possible to operate the mobile telephone in which the semiconductor module is incorporated in a stable manner.

(6) Since a plurality of semiconductor chips, passive parts and the like can be incorporated into the module board with high integration, the semiconductor module can be miniaturized.

What is claimed is:

1. A power amplifier module including a power amplifying circuit for use in a mobile communication device, comprising:

a module board having a plurality of wirings on an upper surface thereof and external electrode terminals on a lower surface thereof;

a first semiconductor chip disposed over the upper surface of the module board;

a second semiconductor chip overlapped to and above the first semiconductor chip with a gap therebetween;

a first conductive wire electrically connecting the first semiconductor chip and a first wire connection pad disposed over the upper surface of the module board;

a second conductive wire electrically connecting the second semiconductor chip and a second wire connection pad disposed over the upper surface of the module board; and an insulating resin covering the first and second semiconductor chips, wherein the first semiconductor chip includes the power amplifying circuit;

the second semiconductor chip includes a control-use transistor which controls the power amplifying circuit;

wherein the module board has a support on the upper surface thereof, said support body formed of a conductor;

the second semiconductor chip is disposed on the support;

a reference potential electrode is formed on a lower surface of the second semiconductor chip; and the support of the module board is electrically connected with the reference potential electrode.

2. The power amplifier module according to claim 1, wherein the power amplifying circuit is comprised of a multi-stage cascade connection of transistors.

3. The power amplifier module according to claim 1, wherein a heat radiation pad is formed on the lower surface of the module pad;

a first via hole and a second via hole are formed in the module board, said first and second via holes extending from the upper surface to the lower surface of the module board;

a first conductive film and a second conductive film are formed in the first and second via holes, respectively;

a lower surface of the first semiconductor chip and the heat radiation pad are electrically connected via the first conductive film in the first via hole; and the support and the heat radiation pad are electrically connected via the second conductive film in the second via hole.

4. The power amplifier module according to claim 1, wherein a recess portion is formed on the upper surface of the module board; and the first semiconductor chip is disposed in the recess portion.

5. The power amplifier module according to claim 1, wherein the reference potential electrode is electrically coupled with a ground potential.

6. The power amplifier module according to claim 1, wherein a passive part is disposed over the upper surface of the module board.

* * * * *